US006813678B1

(12) United States Patent
Sinclair et al.

(10) Patent No.: US 6,813,678 B1
(45) Date of Patent: Nov. 2, 2004

(54) FLASH MEMORY SYSTEM

(75) Inventors: Alan Welsh Sinclair, Del Mar, CA (US); Sergei Anatolovich Gorobets, Edinburgh (GB)

(73) Assignee: Lexar Media, Inc., Fremont, CA (US)

( * ) Notice: Subject to any disclaimer, the term of this patent is extended or adjusted under 35 U.S.C. 154(b) by 0 days.

(21) Appl. No.: 09/600,708

(22) PCT Filed: Jan. 20, 1999

(86) PCT No.: PCT/GB99/00188

§ 371 (c)(1), (2), (4) Date: Sep. 6, 2000

(87) PCT Pub. No.: WO99/38066

PCT Pub. Date: Jul. 29, 1999

(30) Foreign Application Priority Data

Jan. 22, 1998 (GB) ............................................. 9801373

(51) Int. Cl.[7] ............................................. G06F 12/08
(52) U.S. Cl. ...................................... 711/103; 711/206
(58) Field of Search ................................. 711/103, 206

(56) References Cited

U.S. PATENT DOCUMENTS

| | | | |
|---|---|---|---|
| 4,210,959 A | 7/1980 | Wozniak | 710/74 |
| 4,355,376 A | 10/1982 | Gould | 365/200 |
| 4,405,952 A | 9/1983 | Slakmon | 360/49 |
| 4,450,559 A | 5/1984 | Bond et al. | 714/6 |
| 4,456,971 A | 6/1984 | Fukuda et al. | 703/25 |
| 4,498,146 A | 2/1985 | Martinez | 711/115 |
| 4,525,839 A | 7/1985 | Nozawa et al. | 714/710 |
| 4,616,311 A | 10/1986 | Sato | 711/206 |
| 4,654,847 A | 3/1987 | Dutton | 714/6 |
| 4,710,871 A | 12/1987 | Belknap et al. | 709/237 |
| 4,746,998 A | 5/1988 | Robinson et al. | 360/72.1 |
| 4,748,320 A | 5/1988 | Yorimoto et al. | 235/492 |
| 4,757,474 A | 7/1988 | Fukushi et al. | 365/189 |
| 4,774,700 A | 9/1988 | Satoh et al. | 369/54 |
| 4,800,520 A | 1/1989 | Iijima | 707/206 |
| 4,896,262 A | 1/1990 | Wayama et al. | 710/65 |

(List continued on next page.)

FOREIGN PATENT DOCUMENTS

| | | |
|---|---|---|
| AU | 0 557 723 | 1/1987 |
| EP | 0 220 718 A2 | 5/1987 |
| EP | 0 243 503 A1 | 11/1987 |
| EP | 0 424 191 A2 | 4/1991 |
| EP | 0 489 204 A1 | 6/1992 |
| EP | 0 522 780 A2 | 1/1993 |

(List continued on next page.)

OTHER PUBLICATIONS

Friedman, A., Flash Storage Standardization in PCMCIA Cards, Electronic Design, vol. 43 No. 3, (1995), pp. 128, 130.

Book—*Computer Architecture and Parallel Processing,* Kai Hwang & Faye A. Briggs, McGraw–Hill Book Co., © 1984, p. 64.

Magazine—"State of the Art: Magnetic VS. Optical Store Data in a Flash", by Walter Lahti and Dean McCarron, Byte magazine dated Nov. 1, 1990. 311, vol. 15, No. 12.

Magazine—Technology Updates, Integrated Cirrcuits, "1–Mbit flash memories seek their role in system design", Ron Wilson, Senior Editor, Computer Design magazine 28 (1989) Mar. 1, No. 5, Tulsa OK, US, pp. 30 and 32.

(List continued on next page.)

*Primary Examiner*—Reginald G. Bragdon
(74) *Attorney, Agent, or Firm*—Law Offices of Imam

(57) ABSTRACT

A memory system (10) comprising a non-volatile memory (18) having memory locations (38), and a controller (16) for writing data structures to and reading data structures from the memory. The system (10) is architecturally configured so that the locations (38) can be written to individually but are erasable only in blocks. The controller (16) forms one or more erasable units (39) which are each subdivided into cells (50) each consisting of a group of locations (38). The controller (16) writes data structures to and reads structures from each cell (50) on a per cell basis. The system (10) may comprise a controller (16) embedded in a FLASH memory card. Alternatively, the controller (16) may be embedded in, or implemented in, a host system such as a Personal Computer (PC).

10 Claims, 14 Drawing Sheets

U.S. PATENT DOCUMENTS

| | | | |
|---|---|---|---|
| 4,914,529 A | 4/1990 | Bonke | 360/48 |
| 4,920,518 A | 4/1990 | Nakamura et al. | 365/228 |
| 4,924,331 A | 5/1990 | Robinson et al. | 360/72.1 |
| 4,953,122 A | 8/1990 | Williams | 703/6 |
| 5,070,474 A | 12/1991 | Tuma et al. | 703/24 |
| 5,168,465 A | 12/1992 | Harari | 257/320 |
| 5,198,380 A | 3/1993 | Harari | 438/257 |
| 5,200,959 A | 4/1993 | Gross et al. | 714/723 |
| 5,226,168 A | 7/1993 | Kobayashi et al. | 703/25 |
| 5,268,318 A | 12/1993 | Harari | 438/268 |
| 5,268,870 A | 12/1993 | Harari | 365/185.09 |
| 5,270,979 A | 12/1993 | Harari et al. | 365/185.09 |
| 5,293,560 A | 3/1994 | Harari | 365/185.03 |
| 5,297,148 A | 3/1994 | Harari et al. | 714/710 |
| 5,303,198 A | 4/1994 | Adachi et al. | 365/185.11 |
| 5,315,541 A | 5/1994 | Harari et al. | 365/185.13 |
| 5,337,275 A | 8/1994 | Garner | 365/189.01 |
| 5,341,330 A | 8/1994 | Wells et al. | 365/185.33 |
| 5,341,339 A | 8/1994 | Wells | 365/185.11 |
| 5,353,256 A | 10/1994 | Fandrich et al. | 365/185.11 |
| 5,357,475 A | 10/1994 | Hasbun et al. | 365/103 |
| 5,369,615 A | 11/1994 | Harari et al. | 365/185.19 |
| 5,379,262 A | 1/1995 | Okamoto et al. | 365/230.01 |
| 5,388,083 A | 2/1995 | Assar et al. | 365/185.19 |
| 5,396,468 A | 3/1995 | Harari et al. | 365/218 |
| 5,418,752 A | 5/1995 | Harari et al. | 365/218 |
| 5,422,842 A | 6/1995 | Cernea et al. | 365/185.22 |
| 5,428,621 A | 6/1995 | Mehrotra et al. | 714/721 |
| 5,430,859 A | 7/1995 | Norman et al. | 711/103 |
| 5,434,825 A | 7/1995 | Harari | 365/185.24 |
| 5,438,573 A | 8/1995 | Mangan et al. | 714/711 |
| 5,457,658 A | 10/1995 | Niijima et al. | 365/218 |
| 5,459,850 A * | 10/1995 | Clay et al. | 711/171 |
| 5,471,478 A | 11/1995 | Mangan et al. | 714/711 |
| 5,479,638 A | 12/1995 | Assar et al. | 711/103 |
| 5,485,595 A | 1/1996 | Assar et al. | 711/103 |
| 5,495,442 A | 2/1996 | Cernea et al. | 365/185.03 |
| 5,504,760 A | 4/1996 | Harari et al. | 714/763 |
| 5,508,971 A | 4/1996 | Cernea et al. | 365/185.23 |
| 5,524,230 A | 6/1996 | Sakaue et al. | 711/103 |
| 5,532,962 A | 7/1996 | Auclair et al. | 365/201 |
| 5,532,964 A | 7/1996 | Cernea et al. | 365/189.09 |
| 5,534,456 A | 7/1996 | Yuan et al. | 438/268 |
| 5,535,328 A | 7/1996 | Harari et al. | 714/7 |
| 5,544,118 A | 8/1996 | Harari | 365/218 |
| 5,544,356 A | 8/1996 | Robinson et al. | 707/205 |
| 5,554,553 A | 9/1996 | Harari | 438/264 |
| 5,563,825 A | 10/1996 | Cernea et al. | 365/185.18 |
| 5,566,314 A | 10/1996 | DeMarco et al. | 711/103 |
| 5,568,439 A | 10/1996 | Harari | 365/185.09 |
| 5,583,812 A | 12/1996 | Harari | 365/185.33 |
| 5,592,420 A | 1/1997 | Cernea et al. | 365/185.18 |
| 5,642,312 A | 6/1997 | Harari | 365/185.03 |
| 5,663,901 A | 9/1997 | Wallace et al. | 365/52 |
| 5,693,570 A | 12/1997 | Cernea et al. | 438/107 |
| 5,712,819 A | 1/1998 | Harari | 365/185.29 |
| 5,719,808 A | 2/1998 | Harari et al. | 365/185.33 |
| 5,778,418 A | 7/1998 | Auclair et al. | 711/101 |
| 6,000,006 A * | 12/1999 | Bruce et al. | 711/103 |

FOREIGN PATENT DOCUMENTS

| | | |
|---|---|---|
| EP | 0 544 252 A2 | 6/1993 |
| EP | 0617363 | 9/1994 |
| EP | 0 686 976 A2 | 12/1995 |
| EP | 0712067 | 5/1996 |
| FR | 93 01908 | 8/1993 |
| JP | 59-45695 A | 9/1982 |
| JP | 58-215794 A | 12/1983 |
| JP | 58-215795 A | 12/1983 |
| JP | 59-162695 A | 9/1984 |
| JP | 60-212900 | 10/1985 |
| JP | 61-96598 A | 5/1986 |
| JP | 62-283496 A | 12/1987 |
| JP | 62-283497 A | 12/1987 |
| JP | 63-183700 A | 7/1988 |
| JP | 4-332999 A | 11/1992 |
| WO | 84/00628 | 2/1984 |

OTHER PUBLICATIONS

1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories, Allentown, PA. pp. 24 and 25.

Mendel Rosenblum and John K. Ousterhout, The Design and Implementation of a Log–Structured File System, article, 1991, 15 pgs., Berkeley, USA.

Brian Dipert and Markus Levy, Designing with Flash Memory, book, Apr. 1994, 445 pgs., Annabooks, San Diego, USA.

Science Forum, Inc., Flash Memory Symposium '95,symposium, 1995, 13 pgs.; Hongo,Bunkyo–ku, Tokyo.

Ross S. Finlayson and David R. Cheriton, An Extended File Service Exploiting Write–Once Storage, 1987, pp. 139–147.

Jason Gait, The Optical File Cabinet: A Random–Access File System for Write–Once Optical Disks, article, Jun. 1988, pp 11–22.

Henry G. Baker, Memory Management, book, 1995, pp 399–413.

Sape J. Mullender and Andrew S. Tanenbaum, A Distributed File Service Based on Optimistic Concurrency Control, 1985, pp. 51–62.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers,, pp 71–72.

Hiroshi Nakamura, Junichi Miyamoto, Kenichi Imamiya, Yoshihisa Iwata, Yoshihisa Sugiura and Hideko Oodaira, A Novel Sensing Scheme with On–Chip Page Copy for Flexible Voltage NAND Flash Memories, article, Jun. 1996, vol. E79–C, No. 6 pp. 836–844.

Takaaki Nozaki, Toshiaki Tanaka, Yoshiro Kijiya, Eita Kinoshita, Tatsuo Tsuchiya and Yutaka Hayashi, A 1–Mb EEPROM with MONOS Memory Cell for Semiconductor Disk Application, article, 1991, Journal Of Solid–State Circuits, vol. 26, No. 4. pp 497–501.

Kai Hwang and Faye A. Briggs, Computer Architecture and Parallel Processing, book, 1984, McGraw–Hill, Inc., pp. 64.

Walter Lahti and Dean McCarron, State of the Art: Magnetic VS. Optical Store Data in a Flash, article, 1990, vol. 15, No. 12, pp 311–318.

Ron Wilson, Integrated Circuits; 1–Mbit flash memories seek their role in system design, article, Mar. 1, 1989, No. 6, pp 30(2).

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, pp 24–25.

Steven H. Leibson, Nonvolatile, in–circuit–reprogrammable memories, article, Jan. 3, 1991, EDN, pp 90–102.

Ramon Caceres, Fred Douglas, Kai Li and Brian Marsh, Operationg System Implications of Solid–State Mobile Computers, Oct. 1993, Workshop on Workstation Operting Systems; pp 1–7.

Michael Wu and Wily Zwaenepoel, A Non–Volatile, Main Memory Storage System, 1994, ACM, pp 86–97.

Dave Bursky, Innovative flash memories match DRAM densities: available with a choice of features, flash memories are finding homes in many systems (includes related articles on the origins of flash, and on the differences between NAND and NOR flash memories), May 16, 1994, 9 pgs., Electronic Design, v.42, n.10, The Gale Group.

Anthony Cataldo, New flash enhancements up ante. (Intel's 28F400BV–120 and 28F004BV–120, Atmel's AT29BV010 and AT29BV020, and Samsung Semiconductor's KM29V32000 *flash* memory* devices)(Product Announcement), Mar. 13, 1995, 4 pgs., Electronic News, v.41, n.2056, The Gale Group.

Sam Weber, *Flash* Modules' portability, reusability, small size valued for a host of APPs–Consumer formats flocking to *flash*, Jul. 22, 1996, 9 pgs., Electronic Engineering Times, n.911, CMP Media.

Toshiba, MOS Memory (Non–Volatile), 1995, pp 191–252.

Stan Baker, But Integration Calls For Hardware, Software Changes: Flash: designers face the dawn of a new memory age, Sep. 12, 2003, 5 pgs., Electronic Engineering Times, 1990, N.619, 41, CMP Media.

Toshiba, Toshiba MOS Digital Integrated Circuit Silicon Gate CMOS, (TC58NS512DC) Mar. 21, 2001, 43 pgs.

Toshiba Corporation, SMIL (Smartmedia Interface Library) Hardware Edition Version 1.00, Jul. 1, 2000, 36 pgs.

Toshiba, Toshiba MOS Digital Integrated Circuit Silicon Gate, (TC58512FT), Mar. 5, 2001, 43 pgs.

Toshiba, Toshiba MOS Digital Integrated Circuit Silicon Gate, (TC58DVM92A1FT00), Jan. 10, 2003, 44 pgs.

Toshiba, Toshiba MOS Digital Integrated Circuit Silicon Gate, (TC58DVG02A1FT00), Jan. 10, 2003, 44 pgs.

Toshiba, Toshiba MOS Digital Integrated Circuit Silicon Gate, (TH58100FT), Mar. 5, 2001, 43 pgs.

Nonvolatile Memory Technology Review, A Time of Change, Proceedings 1993 Conference, Jun. 22–24, 1993, Linthicum Heights, MD pp 61–65.

Toshiba Corporation, SMIL (Smartmedia Interface Library) Software Edition Version 1.00, Jul. 1, 2000, 136 pgs.

Toshiba, MOS Memory (Non–Volatile), 1996, 279 pgs.

Dan Auclair, Optimal Solid State Disk Architecure For Portable Computers, symposium, Jul. 9, 1991, SunDisk Corporation pp 1–4.

* cited by examiner

| DRow | Dcell Map | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 0 | 0 | 0 | 0 | 0 | 0 | 0 | 0 | 0 | 0 | 0 | 0 | 0 | 1 | 0 |
| 1 | 0 | 0 | 1 | 0 | 0 | 0 | 0 | 0 | 0 | 0 | 0 | 0 | 0 | 0 | 1 | 0 |
| 2 | 0 | 0 | 0 | 0 | 1 | 0 | 0 | 0 | 0 | 0 | 0 | 0 | 0 | 0 | 1 | 0 |
| 3 | 0 | 0 | 0 | 0 | 0 | 0 | 0 | 1 | 0 | 0 | 0 | 0 | 0 | 0 | 1 | 0 |
| 4 | 0 | 0 | 0 | 0 | 0 | 0 | 0 | 1 | 1 | 0 | 0 | 0 | 0 | 0 | 1 | 0 |
| 5 | 0 | 0 | 0 | 0 | 0 | 1 | 0 | 1 | 1 | 1 | 0 | 1 | 0 | 0 | 1 | 0 |
| 6 | 1 | 1 | 1 | 1 | 1 | 1 | 1 | 1 | 1 | 1 | 1 | 1 | 1 | 1 | 1 | 1 |
| 7 | 0 | 0 | 0 | 0 | 0 | 0 | 0 | 0 | 0 | 0 | 0 | 0 | 0 | 0 | 1 | 0 |

FLASH MEMORY SYSTEM

FIELD OF THE INVENTION

The present invention relates to a non-volatile memory system for data storage and retrieval, where the system comprises a memory having memory locations which can be written to individually but which can only be erased in blocks of locations, and a controller for controlling access to these memory locations; the present invention also relates to a non-volatile memory for use in such a non-volatile memory system and to a controller for controlling the non-volatile memory. In particular, the invention relates to FLASH memory systems having defective memory locations and controllers for FLASH memories.

BACKGROUND OF THE INVENTION AND RELEVANT PRIOR ART

FLASH EPROM (erasable programmable read only memory) devices are commonly used in the electronics industry for non-volatile data storage. FLASH memory devices are architecturally configured to have locations which may be written to individually but may only be erased in groups called erasable blocks. This architectural configuration arises because groups of transistors in FLASH memory are linked by a common erase line. Thus, the size of an erasable block (the number of storage locations) is determined by the architecture of the device, which is established at the design and manufacturing stage, and cannot be altered by the user.

One application of data storage is storing data structures generated by, for example, a Personal Computer (PC). A problem arises if FLASH memory having defective memory locations is used to store data structures because these defective memory locations cannot be used reliably for data storage.

One solution to this problem of having defective locations in a memory is for the FLASH controller to avoid using any erasable blocks containing a defective location. However, if erasable blocks containing defective locations are never used (marked as unusable by the controller) then there may be a great waste of usable memory storage space (depending on the size of the erasable blocks and the number of usable memory locations therein) leading to a low memory harvest (a low ratio of usable memory locations to total memory locations).

It is an object of the present invention to provide a non-volatile memory system which obviates or mitigates the above disadvantage.

It is an object of the present invention to provide a non-volatile memory system including a memory having locations that are not usable for data storage, but where the memory can be used for efficient storage and retrieval of data structures.

SUMMARY OF THE INVENTION

According to a first aspect of the present invention there is provided a memory system for connection to a host, the system comprising:
 a non-volatile memory having memory locations,
 and a controller for writing data structures to and reading data structures from the memory, the system being architecturally configured so that the locations can be written to individually but can only be erased in blocks of locations;

the improvement being that the controller forms at least one erasable unit, where each erasable unit comprises at least one erasable block, and the controller subdivides each erasable unit into groups of locations (where each group is herein called a cell) and the controller writes data structures to and reads data structures from each cell on a per cell basis.

By virtue of the present invention, the memory is re-configured into cells so that the controller may avoid using an individual cell containing a defect, rather than having to avoid using an erasable block containing a defect. This has the effect of increasing the memory harvest.

An erasable unit may consist of only one erasable block. Alternatively, an erasable unit may consist of a plurality of erasable blocks; conveniently, a binary multiple of erasable blocks.

It will be understood that an erasable block will typically be much larger than a cell.

Prior to or during connection to the host, the memory locations in each cell are tested and if a defect is present in even one location in a cell, then the controller identifies the entire cell as being unusable, otherwise the entire cell is identified as being usable for storing data structures.

It will be understood that the term memory location can refer to a single bit of memory storage; whereas, the term cell refers to a large plurality of bits of memory storage, typically a cell may store 256 bytes or 512 bytes.

It will be understood that locations that can be written to individually may be formed by a plurality of physical memory locations, for example, a row of physical memory, so that in this case an entire row is the smallest unit of memory that can be written to individually.

The non-volatile memory may comprise a plurality of memory devices, or only a single memory device. The controller is, preferably, in the form of a master controller having a sub-controller incorporated into the or each memory device. Alternatively, the controller is in the form of a single controller which controls the or each memory device.

Preferably, the controller designates at least one of the usable cells in each erasable unit as being reserved whereby there are unusable cells containing defects, reserved cells for storing control information, and usable cells for storing data received from the host.

Preferably, the reserved cells are used for storing address conversion information for converting an address from the host to an address suitable for accessing the memory.

Preferably, the address conversion is effected by having a plurality of reserved cells linked together.

Preferably, each reserved cell is used to store pointer information for pointing to the next reserved cell until the last reserved cell is reached, which points to an address in the memory storing the address suitable for accessing the memory.

Preferably, reserved cells are configured to have a plurality of entries, where each entry stores a plurality of fields, whereby a field stored in one entry is used to point to a field stored in another entry and only the most recently written field stored in an entry is considered to be valid.

According to a second aspect of the present invention there is provided a controller for use with a non-volatile memory having locations that can be written to individually but can only be erased in blocks of locations, where, in use, the controller forms at least one erasable unit, where each erasable unit comprises at least one erasable block, and the controller subdivides each erasable unit into cells and reads data structures from and writes data structures to the cells on a per cell basis.

The term data structure is used to include all data stored in the memory. Thus, the term data structures includes read/write blocks (that is, blocks of data which are transferred between a PC and the memory) and also control information (that is, information which is generated by, for example, the memory controller).

According to a third aspect of the present invention there is provided a non-volatile memory for use with a controller, the memory having locations that can be written to individually but can only be erased in blocks of locations, the non-volatile memory being configured so that at least one erasable unit is formed, where each erasable unit comprises at least one erasable block, and each erasable unit is subdivided into groups of memory locations called cells, so that data structures are written to and read from the cells by the controller on a per cell basis.

The non-volatile memory may be configured by having each cell in each erasable unit tested and the results of the test for each unit written to a set of locations forming a header within that unit, so that each unit has a header containing header information.

Alternatively, in an erasable unit comprising a plurality of blocks, each cell in each erasable block may be tested and the results of the test for each erasable block written to a header within that block. The controller may read the header information from each of a plurality of erasable blocks and concatenate the header information and store the concatenated header information in a single header in an erasable unit comprising the plurality of blocks which were read.

Preferably, at least one cell in each erasable unit is designated as being reserved for storing control information.

Preferably, a plurality of reserved (control) cells are linked together to form a hierarchy of cells for effecting address conversion, and different levels in the hierarchy of cells are addressed by different bits from a logical address supplied by a host, so that the lowest cell in the hierarchy provides either the actual physical address required or pointer information for pointing to another hierarchy of cells.

BRIEF DESCRIPTION OF THE DRAWINGS

These and other aspects of the present invention will be apparent from the following specific description, given by way of example, with reference to the accompanying drawings, in which.

DETAILED DESCRIPTION OF THE PREFERRED EMBODIMENTS

Figure 1:
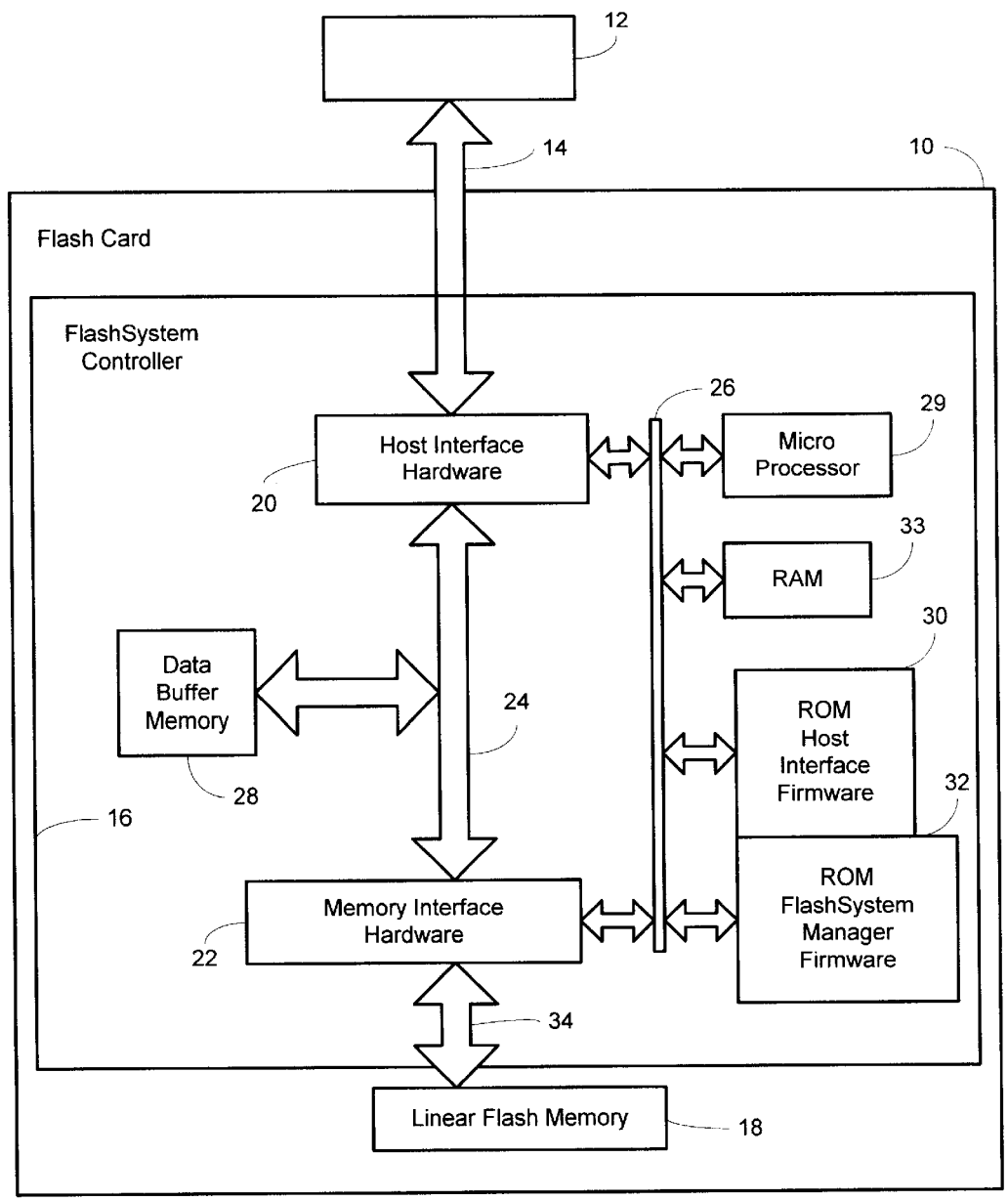
FIG. 1 shows a block diagram of a memory system having a FLASH memory, according to one embodiment of the present invention.

FIG. 1 shows a memory system 10 connected to a Personal Computer 12 by a standard PC interface 14. The system 10 has a controller 16 connected to FLASH memory 18 for storing data structures. These data structures may be generated by the PC 12 (read/write blocks) or by the controller 16 (control information). The controller 16 manages transfer of data structures between the PC 12 and the FLASH memory 18.

The controller 16 has PC interface hardware 20 connected to the PC interface 14. The PC interface hardware 20 is connected to memory interface hardware 22 via data bus 24 and also control bus 26. A buffer memory 28 is also connected to the data bus 24 to provide temporary storage of data which is to be written to the FLASH memory 18. A microprocessor 29 is embedded in the controller 16. The microprocessor 29 communicates with PC interface firmware resident in non-volatile memory 30 and controller management firmware also resident in non-volatile memory 32 (shown separately for clarity) via the control bus 26 and using volatile memory 33. The memory interface hardware 22 communicates with the FLASH memory 18 via a second data bus 34.

The FLASH memory 18 is, typically, a 16 MBit memory architecturally configured to have thirty-two erasable blocks (one of which is shown by way of example as block 36 in FIG. 2), each erasable block 36 having memory locations for storing 64 Kbytes.

Figure 2:
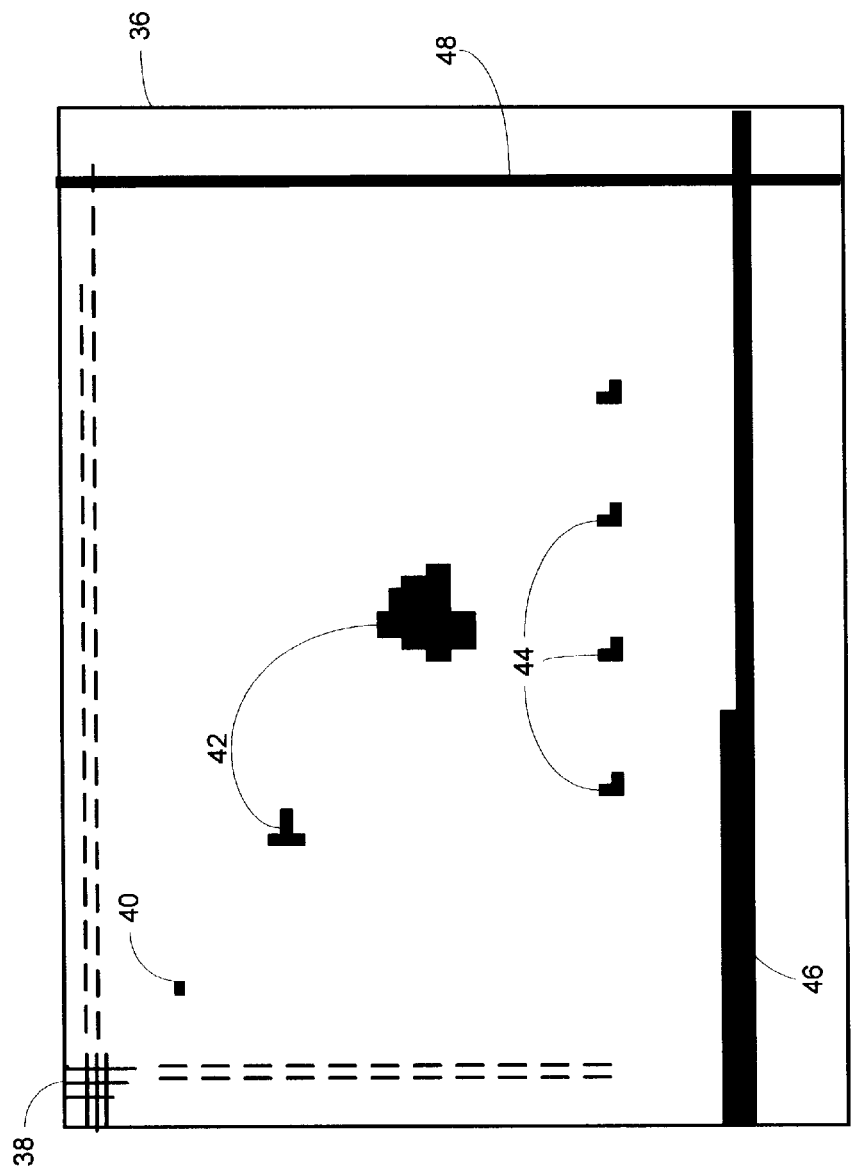
FIG. 2 shows different configurations of defects which may occur in one of the erasable blocks of the FLASH memory of FIG. 1.

The or each erasable block 36 is byte addressable and has 65536 byte-wide memory locations 38, some of which, typically, are defective. By way of example, FIG. 2 shows a group of approximately ten non-defective locations 38 in the top left hand corner of block 36 and different configurations of defective locations, such as point .40 (i.e. a simple single defective location), cluster 42, repeating cluster 44, row 46 and column 48 defects. For clarity, the size of the locations 38 have been enlarged relative to the erasable block 36.

Access to the memory 18 always requires a physical address (which addresses a physical memory location); therefore, a logical address (such as that received by the controller 16 from the PC 12) must be translated to a physical address to locate the data structure as stored in the physical device (memory 18).

All read/write blocks are written to and read from memory 18 as a serial block transfer operation with a word size of one byte (eight bits).

Figure 3A:
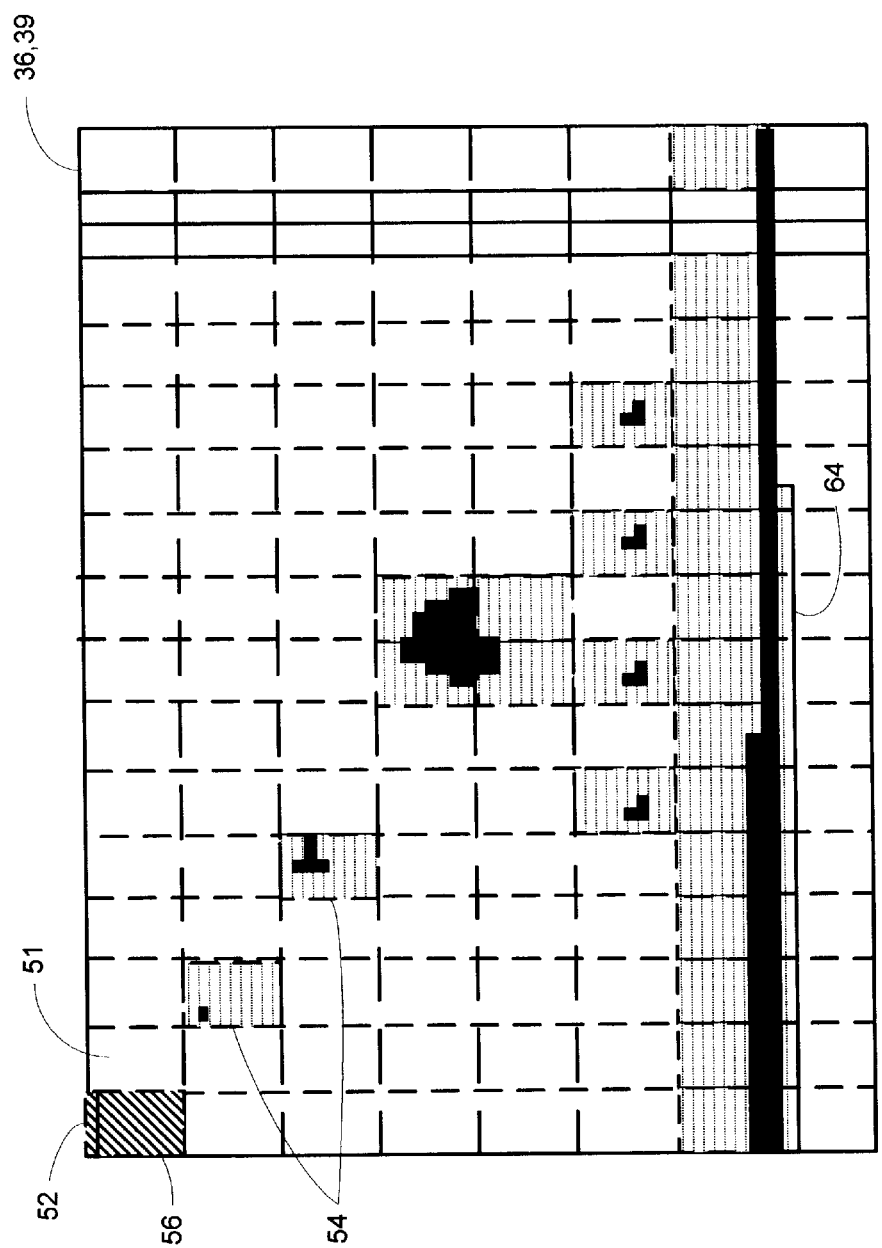
FIG. 3A shows the erasable block of FIG. 2 subdivided into cells to form an erasable unit.
Figures 3B, 6B:
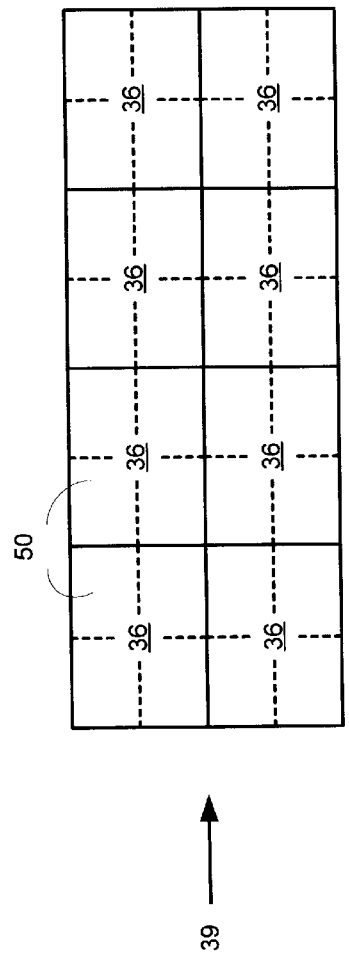
FIG. 3B shows an erasable unit comprising eight of the FIG. 2 erasable blocks.
FIG. 6B illustrates part of the cell map of FIG. 6A resulting from FIG. 5.

In accordance with the present invention, the controller 16 creates an erasable unit 39 which may comprise one or more erasable blocks 36. In one embodiment, as shown in FIG. 3A, the erasable unit 39 consists of one erasable block 36. In other embodiments, an erasable unit 39 may comprise a plurality of erasable blocks 36, for example, a binary multiple of erasable blocks 36 which are sequentially located in memory 18, as shown in FIG. 3B where an erasable unit 39 comprises eight erasable blocks 36.

The controller 16 ensures that each erasable unit 39 is independent of all other erasable units 39 by ensuring that data structures stored in one erasable unit 39 do not overlap into another erasable unit 39.

Prior to incorporating the FLASH memory 18 into the memory system 10, the memory locations 38 are tested and the physical addresses of all faulty locations are stored in a header near the start (lowest physical address) of each erasable unit 39. The header is a sequence of m memory locations, the first location of which is near to the start of an erasable unit. Thus, each erasable unit 39 contains the physical addresses of all of the defective locations, such as 40, 42, 44, 46, 48 in that erasable unit 39. This means that m (non-defective) memory locations are not available for storing data sent by the PC 12, but these m locations are not necessarily the first m (or even consecutive) physical addresses in an erasable block, because the locations may be arranged in columns.

Referring to FIG. 3A and FIG. 2, the controller 16 forms an erasable unit 39 by subdividing each erasable block 36 into groups of neighbouring memory locations 38: these groups of neighbouring memory locations 38 are herein called cells 50. No physical subdivision of the memory actually occurs. The controller 16 merely considers each erasable unit 39 as being comprised of a certain number of cells, where each cell is a group of adjacent memory locations.

To minimise the storage space required the cells are preferably identical in size. Variable sized cells may be used, but would be much more complex.

Each cell 50 contains 512 addressable memory locations 38, each memory location 38 being one byte wide. The locations are arranged within a cell 50 as sixteen columns and thirty-two rows.

The controller 16 generates a cell map for each erasable unit 39, where the cell map stores the locations (physical addresses) of defective cells (that is, cells having at least one defective location) in the unit 39. The controller 16 is designed for a particular memory architecture (erasable block size and erasable unit size) so that the cell map corresponds to the grid array of locations in the erasable unit 39. The controller 16 then stores the cell map as header information in the header 52 of the corresponding erasable unit 39.

The cell map is generated by a test unit (not shown) and written to the header 52 during the manufacturing test process for the FLASH memory 18, but may be updated by the controller 16 if failures occur during the operating life of the device.

The controller 16 controls erasure of an erasable unit 39, and prior to erasure the associated cell map is written to the erasable block buffer memory 28 and written back to the erasable unit 39 after erasure is complete. A back-up copy of the cell map is also written to the next erasable unit 39 for security purposes.

If a cell 50 contains one or more defective memory locations, then the cell 50 is marked as defective (in the cell map), as will described in more detail below.

Each erasable unit 39 will be able to store data in cells 50 which are available for data storage (usable cells 51) but not in defective cells 54 or in cells allocated (reserved) for storing control information (control cells 56), such as the header 52. Thus the logical capacity (the number of addressable locations available for data storage) of each erasable unit 39 will be smaller than the physical capacity (the total number of addressable memory locations 38) of each erasable unit 39.

Read/write blocks having identical logical lengths (that is, the same number of data bits) may occupy different amounts of physical memory space (a different number of memory locations 38) because of defective cells 54 and control cells 56 (both of which are skipped when read/write blocks are read or written). This is illustrated in FIG. 4.

Figure 4:
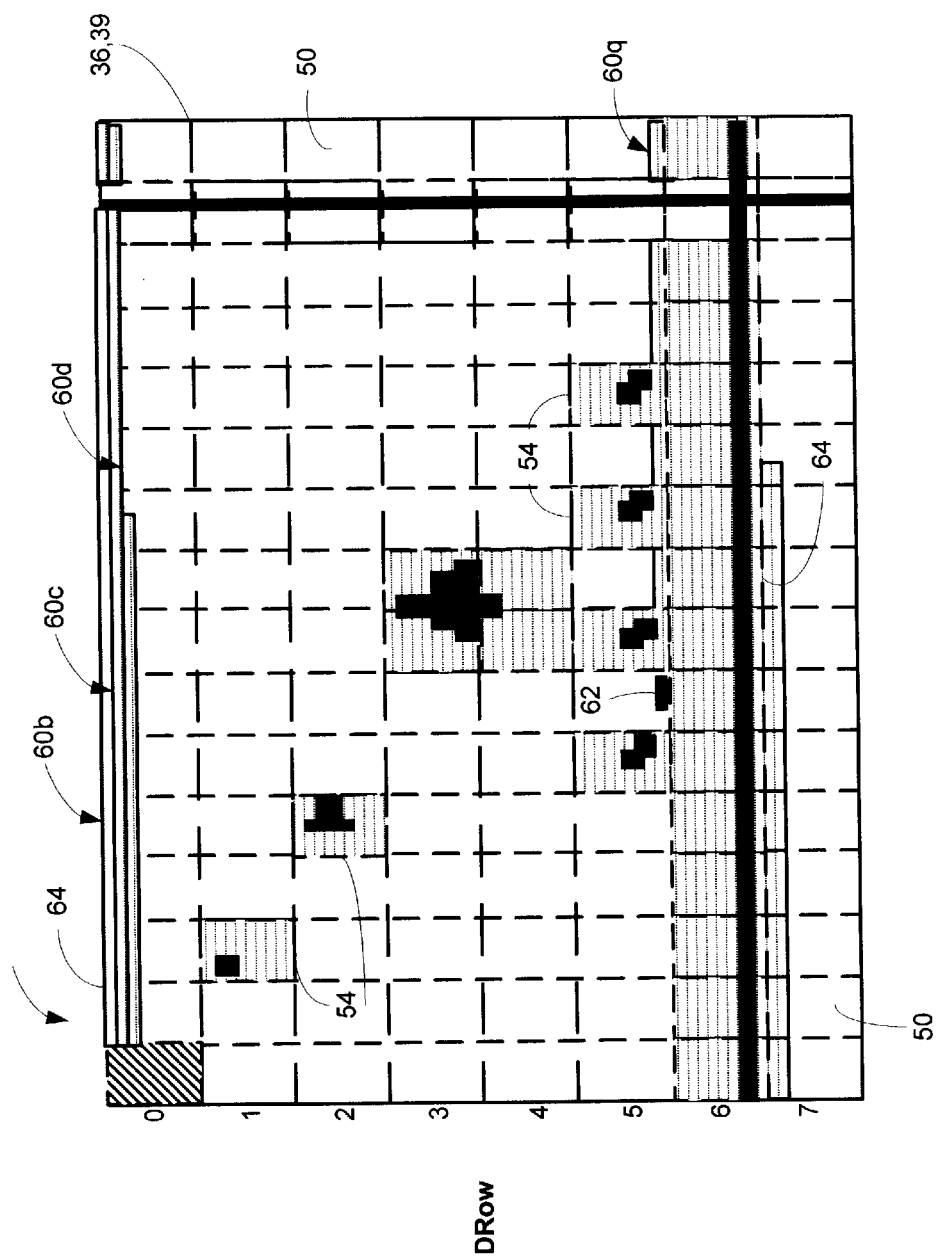
FIG. 4 shows the erasable unit of FIG. 3A having five data structures stored therein.

In FIG. 4, five read/write blocks 60a, b, c, d and q are stored in the erasable unit 39. Read/write blocks are usually stored contiguously in one or more rows of an erasable unit 39; for example, a first read/write block may finish at row 1 column 4 of a usable cell 51, and the next read/write block will normally start at row 1 column 5 of the same usable cell 51. An entire row in an erasable unit 39 (frequently spanning many usable cells 51) is filled with read/write blocks before the next row is used. Read/write blocks are therefore intended to be contiguous through rows of the locations in the erasable unit 39 and independent of the cells 50. This is the way that 60a, 60b, 60c, and 60d are stored. The starting location of 60b is at the address immediately after the address of the last location of 60a, the starting location of 60c is immediately after the address of the last location of 60b, and so on.

However, to illustrate the effect of having many defective cells in close proximity, read/write block 60q is shown located near to the bottom of the erasable unit 39 (because there are more defective cells near the bottom of unit 39 in FIG. 4).

In the absence of defective cells 54 and control cells 56, read/write blocks would be located at contiguous sequential addresses, filled on a row by row basis, within a single erasable unit 39. Read/write blocks 60b, 60d, and 60q have identical logical lengths. As can be seen from FIG. 4, read/write blocks 60 can start at any column location of any row within a cell 50; and, similarly, may finish at any column location of any row within a cell 50. There is no requirement to start at a particular row or column, or to finish at a particular row or column.

Read/write block 60q is spread out over a much larger area of memory than block 60d, because twenty defective cells 54 are skipped by block 60q; whereas, only one defective cell 54 (and the one control cell 56) is skipped by block 60d.

Each read/write block 60 has a header portion 62 and a data portion 64. The header portion 62 typically occupies twelve bytes of memory 18 and includes: a flag to indicate whether the data in the data portion 64 is valid; a logical block address for the read/write block; error correcting codes (ECC) for protecting the data in the header portion 62; a code to indicate the type of data stored (for example, compressed, uncompressed, protected, and such like); and the physical address of the next read/write block 60.

The data portion 64 contains the data which is stored. The length of the data portion 64 is determined by the system 10. An error correcting code may be added to the data by the controller 16. Read/write blocks 60 received from the PC 12 have a fixed size which is determined by the PC interface firmware 30.

It will be appreciated that the logical capacity of each erasable unit 39 is variable and depends on the number of defective cells 54 and the number of control cells 56.

When a read/write block 60 is to be written to FLASH memory 18 then the controller 16 determines a suitable starting address for the block 60. The choice of starting address depends on the particular algorithm implemented by the controller 16. For example, the controller 16 may fill an entire row before incrementing to the next row: alternatively, the controller may fill an entire column before incrementing to the next column. The choice of algorithm used may depend on the architecture and characteristics of the memory device 18.

In this embodiment entire rows are filled first. That is, the lowest usable row address is used as the starting address and an entire row is filled (by incrementing the column address) before the row address is incremented. Thus, the controller 16 searches the cell map for the lowest usable row address.

The controller then determines the number of usable cells 51 available for storing the read/write block 60 before the first defective cell 54 is reached. The number of available memory locations can easily be determined from the number of usable cells 51 because there are sixteen columns of locations in each cell 50, so the number of available memory locations is equal to the number of usable cells 51 before the first defective cell 54 multiplied by sixteen.

If the entire block 60 can be stored without impinging on a defective cell 54 (or a control cell 56) then the block 60 is stored. Examples of this are blocks 60a and 60c in FIG. 4.

If, however, only a portion of the block 60 can be stored before a defective cell 54 (or control cell 56) is reached then the portion that can be stored is transferred to the memory and stored, the transfer is then halted while the controller 16 determines the location of the next usable cell 51. The controller 16 then determines how much data can be stored between the next usable cell 51 and the defective cell 54 (or control cell 56) immediately after the next usable cell 51. The controller 16 then increments the address to be written to so that the address to be written to equals the first usable address, and then initiates data transfer, and so on.

Alternatively, if the characteristics of the FLASH memory device do not easily allow a new address for data transfer to be set up, for example, because it is configured for serial data transfer, a data transfer clock may be generated by the controller 16 and applied to the memory device whilst no data is actually transferred. When internal access pointers within the memory device (driven by the clock signal) reach the next usable address, the data transfer is re-initiated by the controller 16.

Thus, data transfer between the PC 12 and the FLASH memory 18 is segmented: each segment is stored in a set of sequential memory locations. The length of each segment equals the number of contiguous available memory locations. A segment stops at the last address before a defective cell 54 (or control cell 56) is reached, and restarts (at the lowest usable address in the cell) when the next usable cell 51 is reached. Thus, the controller 16 determines the size of the segment to be transferred. The effect of this segmented transfer when many defective cells are present in the memory 18 is illustrated by read/write block 60q.

A similar procedure is followed when data is to be read from FLASH memory because defective cells (and control cells) must be skipped when reading from memory. The controller 16 skips cells in the following way. When the last address in a segment is read, the controller 16 then increments the address to the first usable row address in the first usable cell 51 immediately after the defective cell 54 or control cell 56.

When a read/write block 60 is read and any ECC associated with that read/write block 60 indicates that there are errors in the data read then the controller 16 identifies the particular defective bits and marks the usable cell or cells 51 containing these bits as defective and updates the corresponding cell map. Alternatively, the controller 16 may mark all of the usable cell or cells 51 containing the read/write block 60 as defective. In this way the controller 16 verifies the integrity of each usable cell 51 each time data is read from that usable cell 51. Thus, the controller 16 can identify new defects occurring in usable cells 51. In other embodiments a self-test procedure may be used. On initiation of the self-test procedure the controller 16 writes data to and then reads data from each usable cell 51 to determine whether any of the usable cells 51 contain defects.

The controller 16 uses a write pointer (as described in GB 2 291 991) to point to the memory location to be written to next and an erase pointer to point to the erasable unit 39 to be erased next. Read/write blocks are always written to the location pointed to by the write pointer and the controller 16 ensures that there is at least one erased erasable unit 39 between the write pointer and the erase pointer. The controller also uses a separate control cell write pointer to point to the next memory location to be written to with control information. The control write pointer only points to locations within control cells 56.

Figure 5:
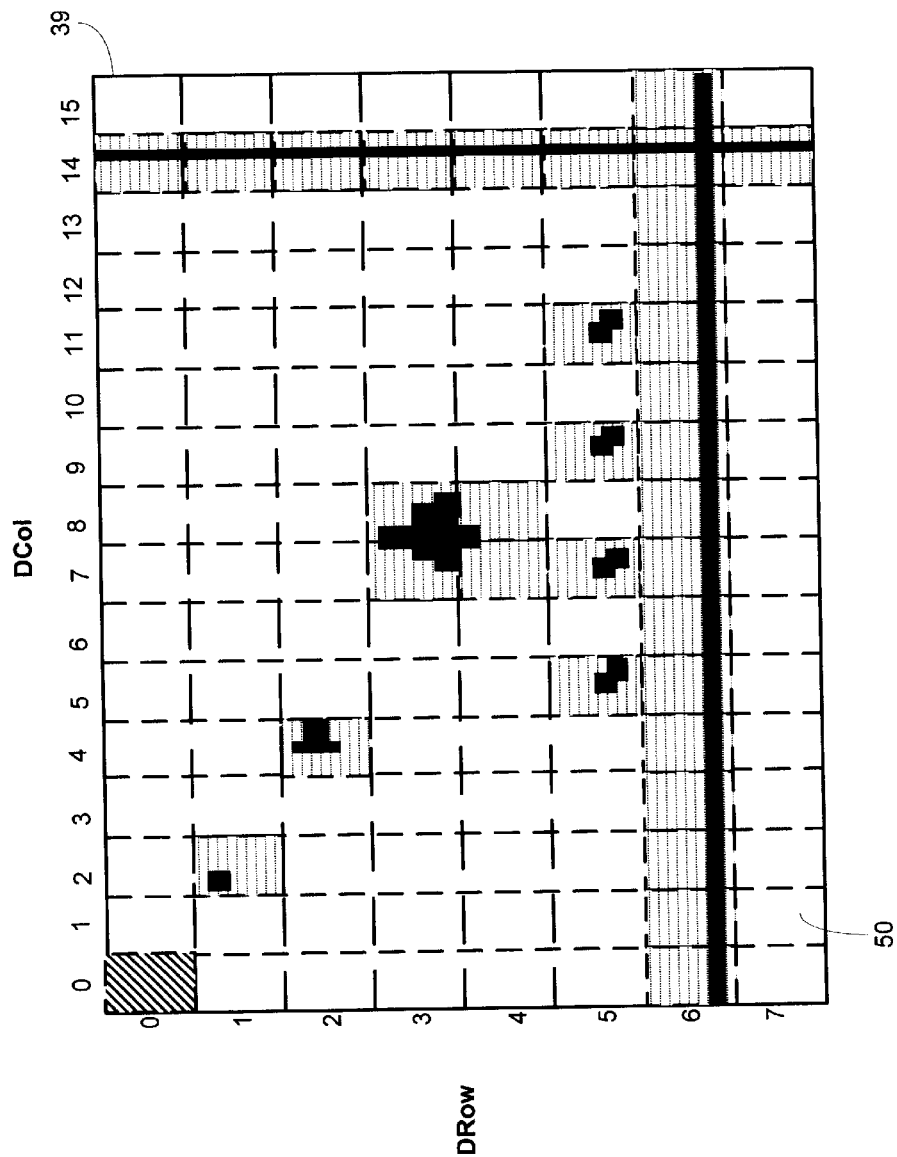
FIG. 5 illustrates how part of a cell map is constructed for the erasable unit of FIG. 3A.

FIG. 5 shows an erasable unit 39 having markings to illustrate how part of a cell map is constructed, in that the columns of cells are numbered from 0 to 15 and the rows are numbered from 0 to 7.

Figure 6A:
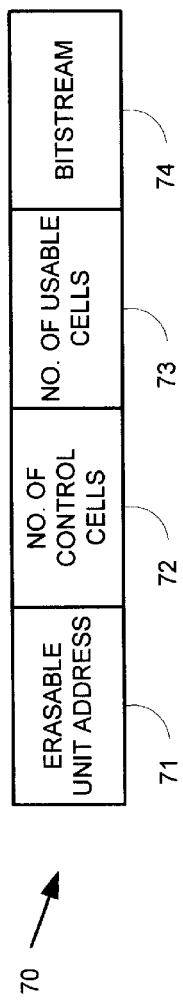
FIG. 6A shows the format of a typical cell map.

FIG. 6A shows the format of a typical cell map 70. Each cell map 70 contains the address 71 of the erasable unit 39 to which the map 70 relates; the number 72 of available control cells 56 in the erasable unit 39; the number 73 of usable cells 51 in the erasable unit 39; and a stream of bits 74 representing the usable cells 51 in the block 36.

FIG. 6B illustrates how the stream of bits 74 is generated from FIG. 5. In FIG. 6B, the stream of bits 74 is shown in a grid pattern corresponding to the cell pattern of FIG. 5. In FIG. 6B, an additional first column 75 and first row 76 are shown for clarity, but are not actually stored. The cell map 70, which includes the eight by sixteen array of ones and zeros (the stream of bits 74), is stored in the header 52 of each erasable unit 39. In embodiments where one erasable unit 39 consists of a plurality of erasable blocks 36, a cell map may only be stored in the first erasable block of the erasable unit, but that cell map is used for all of the erasable blocks in the erasable unit. Alternatively, a cell map for an erasable unit comprising a plurality of erasable blocks may overlap several erasable blocks, particularly if each erasable block consists of one row or a small number of rows of memory locations. The first column (Drow) 75 indicates the cell row number and the first row 76 indicates the cell column number (as per the notation in FIG. 5). Column 75 and row 76 are not stored in the header 52. If a cell is usable then the number zero is inserted in the relevant row and column; however, if a cell is unusable (for example, because it is a defective or a control cell) then the number one is inserted in the relevant row and column.

For added security, a copy of the cell map 70 for an erasable unit 39 may be stored in the header of the following erasable unit 39. This is to ensure that if a location in the header 52 of an erasable unit 39 fails, then the cell map 70 stored in that header 52 can be recovered from the following header 52. Information in the cell map 70 is protected by an ECC which is incorporated in the information stored in the header 52.

The header 52 contains a cell map 70 for the associated erasable unit 39, a cell map 70 for the preceding erasable unit 39, a unique identification to enable the controller 16 to identify the header 52, a write start flag, a write finish flag, a control cell start flag, a control cell finish flag, and either control cell header information or control cell header pointer information.

The write start flag is asserted (set to the non-erased state) when a read/write block is written to the erasable unit 39 for the first time after erasure of the unit 39. The write finish flag is asserted when the erasable unit 39 is filled with read/write blocks.

The control cell start flag is asserted when control cells (other than the control cell containing the header 52) are first written to after erasure of the erasable unit 39. The control cell finish flag is asserted when all control cells are written to.

The control cell header pointer is only needed if there is insufficient room in a single control cell for the entire header information, in which case the control cell header information is stored in another control cell which is pointed to by the control cell pointer.

Figure 7:
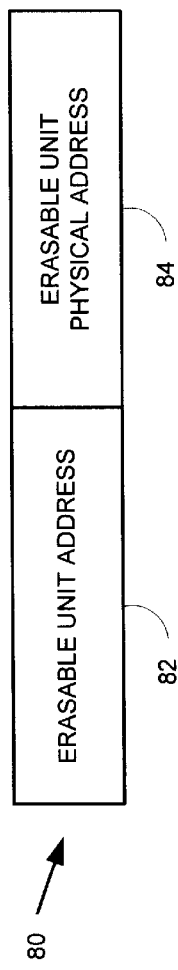
FIG. 7 shows the format of a physical address for accessing the memory of FIG. 1.

FIG. 7 shows the format of a physical address 80 for accessing (i.e. reading from and writing to) the FLASH memory 18. The physical address 80 has a first field 82 representing an erasable unit 39. In this embodiment, an erasable unit 39 is equal in size to an erasable block 36. The physical address 80 also has a second field 84 containing an address within an erasable unit 39. The address in the second field 84 is with respect to the total physical address space of the erasable unit 39. The second field 84 is used to define the location of any data structure within an erasable unit 39.

Figure 8:
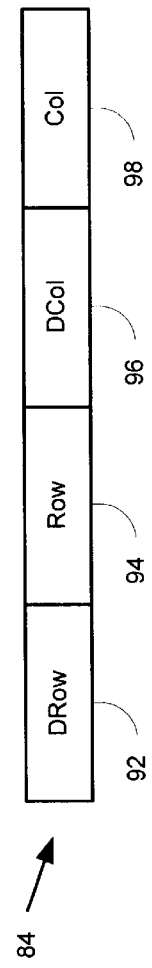
FIG. 8 shows a portion of FIG. 7 in more detail.

FIG. 8 shows the second field 84 in more detail. The second field 84 comprises a cell row 92, a row 94, a cell column 96, and a column 98. The cell row 92 is the particular row of cells within an erasable unit 39 which is to be accessed. The row 94 is the physical address of the particular row of locations (within the cell row 92) which is to be accessed. This row address is relative to the first row in the cell. Similarly, the cell column 96 is the particular column of cells within an erasable unit 39 which is to be accessed, and the column 98 is the physical address of the column of locations (within the cell column 96) which is to be accessed. The column address is relative to the first column in the cell.

Figure 9:
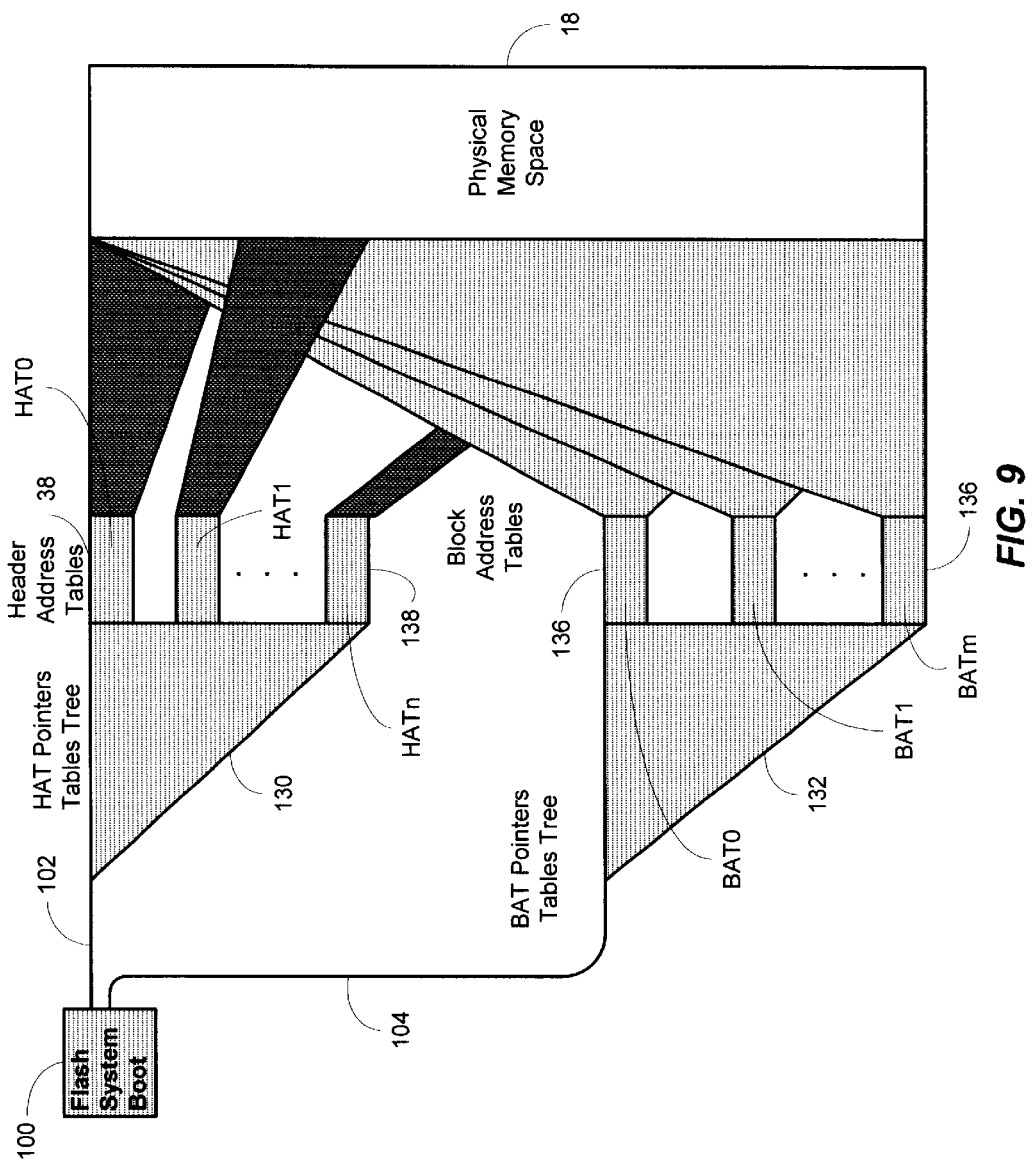
FIG. 9 shows the hierarchy of addressing used for converting logical addresses to physical addresses for the system of FIG. 1.
Figure 10:
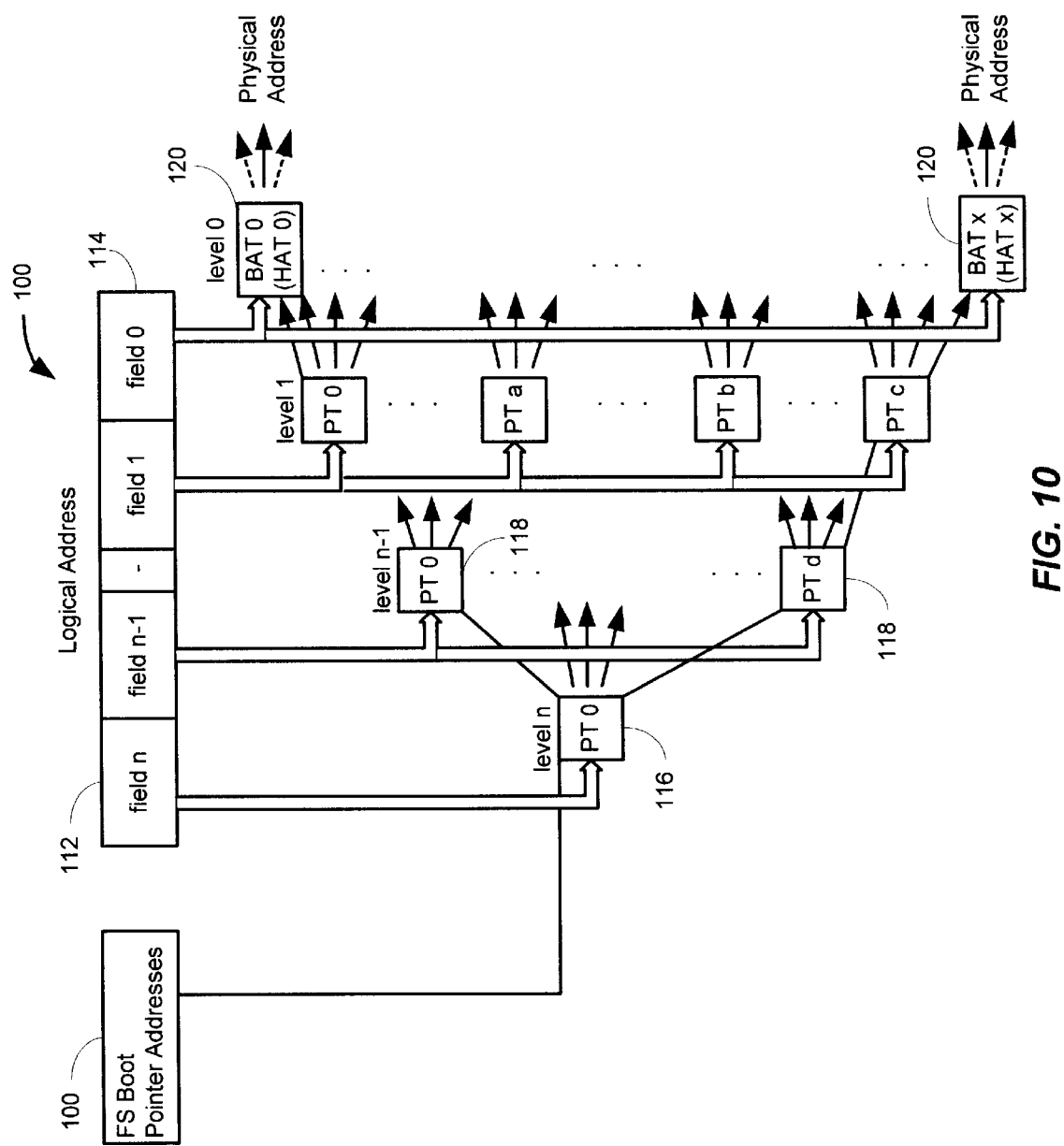
FIG. 10 shows a part of FIG. 9 in greater detail.

The order of data structures stored in physical address space is completely independent of the logical block address (LBA) of each data structure. The data structure corresponding to any particular logical block may be located anywhere in physical address space. The data structure physical address (PBA) which is assigned to each LBA is defined in a set of tables known as block address tables (BAT) which can be accessed via a pointer tables (PT) tree structure, as illustrated in FIGS. 9 and 10.

A boot structure 100 is stored in a control cell 56 in the first erasable unit 39 in the memory 18. Copies of the boot structure 100 are also stored in the second and last erasable units 39 in the memory 18 for security purposes. The control cell 56 used for storing the boot structure 100 is selected by the controller 16 to be the first control cell position immediately after the control cell containing the header 52.

The boot structure 100 is the first data structure that the controller 16 must locate each time the system is initialised (that is, each time the system has power restored after having been switched off). The reason that the boot structure 100 must be located first is that it contains two fundamental pointers: a header pointer 102 and a block address pointer 104. The header pointer 102 is used to point to a header address table (HAT) for determining the address of each header 52 in each erasable unit 39. The HAT pointed to is the highest level (or root) HAT. The block address pointer 104 is used to point to a block address table (BAT) for converting logical addresses received from the PC 12 to physical addresses suitable for accessing the FLASH memory 18. The BAT pointed to is the highest level (or root) BAT.

The boot structure 100 stores the following information:
1. a unique signature to aid identification by the controller 16;
2. a pointer which points to the header of the erasable unit in which the structure 100 is located;
3. the number of the highest accessible erasable unit 39 in the memory 18;
4. the total number of columns in a cell 50;
5. the total number of rows in a cell 50;
6. the total number of columns of cells in an erasable unit (for example, 16 for FIG. 3);
7. the total number of rows of cells in an erasable unit (for example, 8 for FIG. 3);
8. the logical address of a control block (will be described below);
9. the length of read/write block currently being used in the system 10;
10. the length of any ECC used in the read/write blocks;
11. the block address pointer 104; and
12. the header address pointer 102.

The block address pointer 104 defines the physical address of the control cell in which the highest level (also known as root) block address table is located. Similarly, the header address pointer 102 defines the physical address of the control cell in which the highest level (also known as root) header address table is located.

FIG. 10 shows a logical address 110 of a read/write block 60, the address comprising n+1 fields (representing levels), the nth field (representing the highest level, or root of the tree) 112 being the most significant bits of the address 110 and the zero field (representing the lowest level, or leaf of the tree) 114 being the least significant bits of the address 110.

For each of the header address pointer 102 and the block address pointer 104, the boot structure 100 contains an address which points to the (physical) starting address of a single nth level address table pointer table 116. The controller 16 uses the value of the nth field 112 to point to a single entry in the nth level pointer table 116. The single entry pointed to in the nth pointer table 116 is used to point to one of the address table n−1th level pointer tables 118. The particular entry in the n−1th level table 118 which is pointed to is determined by the n−1th field of the logical address. This multi-level pointing process continues until the zero field 114 is used to point to an entry in the address table 120 which contains the actual physical address to be accessed. The number of levels required is defined by the number of entries per table 116,118,120 and the total logical capacity of the memory 18.

It will be appreciated that the same type of multi-level tree structure can be used to determine the physical address of a header 52 as for determining the physical address of a read/write block 60.

FIG. 9 illustrates a tree structure arrangement for both a header 52 and a read/write block 60. A header address tree 130 is used to determine the physical address of a header 52, and a block address tree 132 is used to determine the physical address of a read/write block 60.

The zero level tables (corresponding to 120 in FIG. 10) pointed to by the block address tree 132 are the block address tables (BAT) 136. Similarly, the header address tree 130 points to the header address tables 138.

There are two types of block address tables 136: primary BATs (PBATs) and secondary BATs (SBATs). A PBAT may be paired with one specific SBAT. PBATs and SBATs may be located anywhere in physical address space, however, they are always stored in control cells 56.

Each erasable unit 39 has at least one header control cell for maintaining the addresses (in the form of control cell headers) of the PBATs and SBATs within the erasable unit 39. This header control cell may also contain the header 52, depending on the size of the control cells 56 being used. Each PBAT contains entries for a predetermined number of read/write blocks 60.

An entry in a PBAT may contain the physical address in memory which is to be accessed or it may contain a pointer to an entry in the associated SBAT. Similarly, the SBAT may contain the physical address in memory which is to be accessed or it may contain a pointer to another entry in the same SBAT. Thus an indirect addressing chain may be constructed which tracks the movements of a read/write block. This provides an indirect addressing mechanism which allows the BAT 136 to be updated when a read/write block is rewritten to a different location in memory 18.

Figure 11:
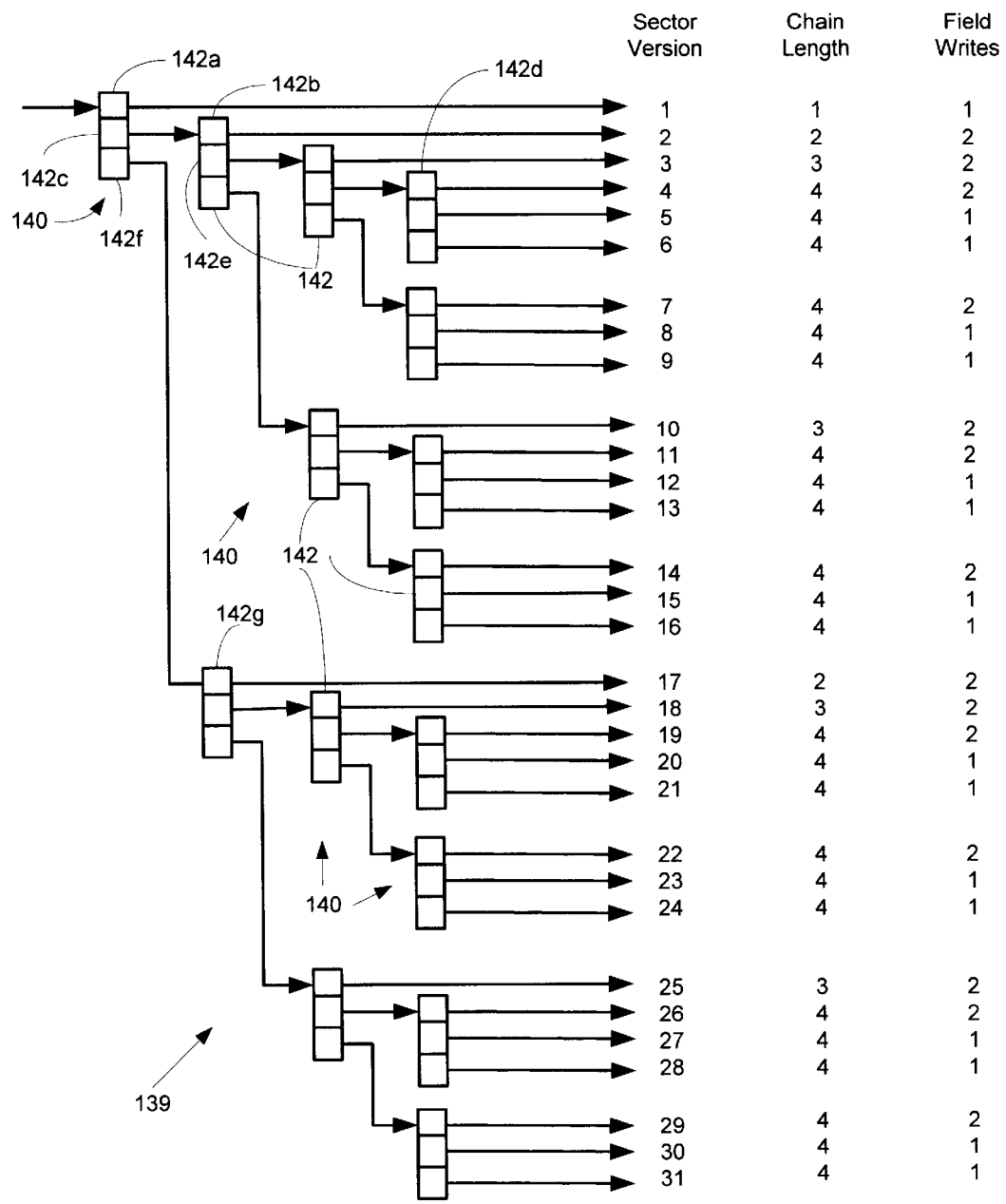
FIG. 11 shows the chain structure of the hierarchy of addressing of FIG. 9, in the form of a secondary block address table.
Figure 12:
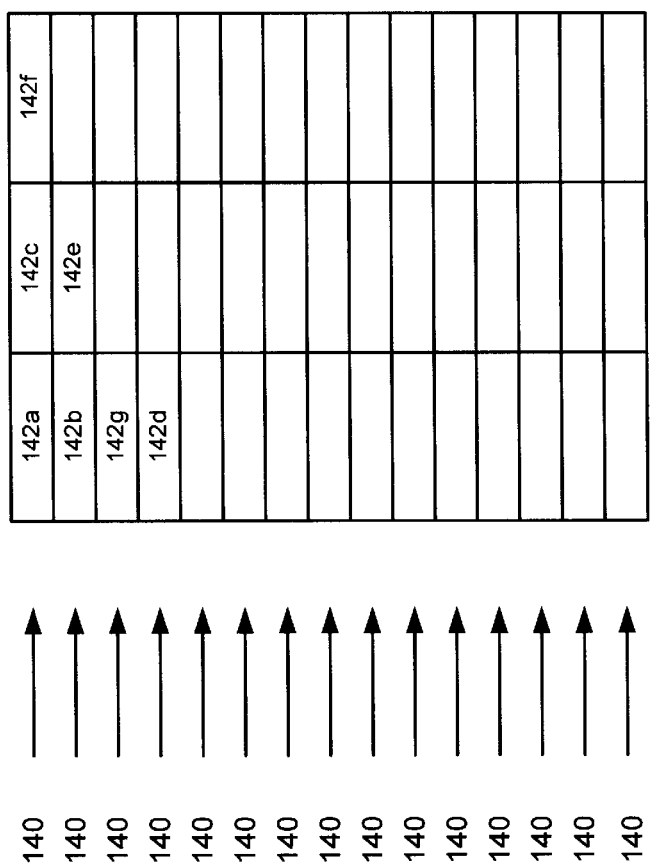
FIG. 12 illustrates the table of FIG. 11 as stored in a control cell.

FIG. 11 shows the chain structure of a secondary block address table (SBAT) 139. Each SBAT entry 140 has three SBAT fields 142. Each field 142 can be written sequentially and independently. In the example shown in FIGS. 11 and 12, a read/write block 60 may be written (relocated) thirty-one times before the SBAT needs to be erased. The maximum chain length (each link of the chain being an SBAT field 142) in FIG. 11 is four fields 142.

The first time that an SBAT is required (sector version one) the new read/write block address is written to field 142a. The next time that the read/write block 60 is written (relocated) corresponds to sector version two, and the new address is written to field 142b, which is pointed to by field 142c; thus, two fields (142b and c) have to be written. The next time that the read/write block is written (relocated) the new address is written to field 142d, which is pointed to by field 142e; again, two fields (142d and e) have to be written. Thus, for each entry 140, only the most recently written field is treated as valid. This procedure is repeated until all of the fields have been written, which occurs in FIG. 11 when sector version thirty-one is written. Another example is when the read/write data block is written for the seventeenth time (sector version 17 in FIG. 11), in which case fields 142f and 142g are written.

When all of the fields have been written, the whole SBAT 139 then requires erasure before it can be used. It will be appreciated that, for this structure, at most two fields have to be updated each time a read/write block 60 is relocated. The chain structure for an SBAT 139 has the advantage that it allows easy reconfiguration of chains as the controller writes and re-writes data blocks, without producing long links of chains which might hinder the speed of operation of the memory system 10.

Figure 13:
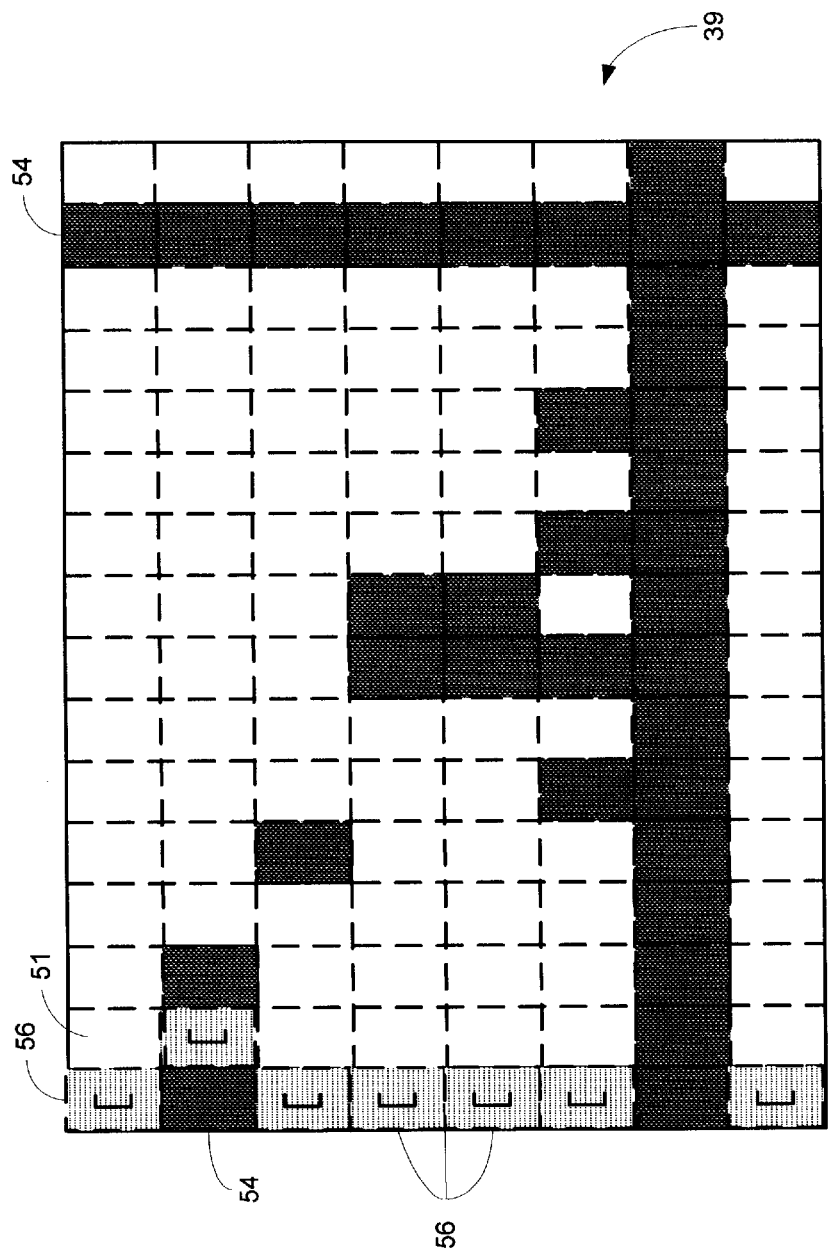
FIG. 13 shows the allocation of control cells in an erasable unit after erasure of that unit.

FIG. 13 shows an erasable unit 39 having the same defective cells 54 as FIGS. 3 to 5, plus a defective cell at row 2 column 1. Each control cell 56 is located at the first usable cell 51 in each row. Each time an erasable unit 39 is erased, it must be initialised by reserving usable cells 51 for use as control cells 56 according to some predetermined algorithm.

The number of usable cells 51 available as control cells 56 in each erasable unit 39 is defined by a parameter stored in the cell map 70. The value of this parameter cannot be less than the number of control cells 56 necessary for allocating the boot structure 100 and the header 52. In this embodiment, the control cells 56 are allocated to the first usable cell 51 in each non-fully defective row of the erasable unit 39.

This limitation on the maximum number of control cells 56 that can be used arises because some FLASH memories are liable to disturbance effects caused by multiple separate write operations within the same row of the memory device. To counteract this, the number of control cells 56 which may be allocated in the same row is restricted.

In this embodiment, the maximum value of the parameter is equal to the total number of usable cells 51 divided by sixteen because there are sixteen columns of cells in each erasable unit 39, and there is the restriction that only one cell can lie in each row.

When control cells 56 are written to, only one row in the control cell 56 is written to then the row is incremented and the next row in the control cell is written to, and so on. In contrast, when usable cells 51 are written to, entire rows across the erasable unit 39 are written to before the row is incremented. Control data consists principally of short fields of data which are written independently at different times. Therefore, the use of a restricted number of control cells in a row for storage of control data, rather than the use of a data structure like a read/write block in usable cells, provides a means of limiting the number of separate write operations within the same row of the memory device.

These control cells 56 are used to store the block address tables (BAT) 136, the pointer tables (PT) 116 and 118, the header address tables (HAT) 138, the header 52, and the boot structure 100.

Each control cell 56 has a header with a unique code to identify whether it stores information relating to a BAT 136, a PT 116, a HAT 138, a header 52, or a boot structure 100. The control cell header also has an obsolete flag to indicate whether the information stored within the control cell header is valid or obsolete.

As explained above, the headers for all control cells 56 within an erasable unit 39 are stored together in a single header control cell within the unit 39, which may also contain the header 52 for the unit 39.

Each PBAT 136 has a plurality of entries, each entry relating to a specific read/write block logical address. Each PBAT 136 relates to a set of contiguous logical addresses. Separate independent PBAT's exist to provide sufficient capacity for all logical read/write blocks in the device. Each PBAT entry has, for example, three address fields. When a PEAT entry is written for the first time after erasure, the physical address of the read/write block is written to the first address field. When the same logical block is rewritten at some later time, the new physical address is entered in the second address field and the first field is no longer valid. When the same logical block is again rewritten at some later time, the third field is used to provide an indirect address (an address for an SBAT entry 140). The controller 16 automatically considers the address in the highest (most recently written) of the three address fields as the valid address and disregards all addresses in lower fields.

Some control information must be retained in the memory 18 to allow correct initialisation of the system 10 when the system 10 is first detected by the PC 12. To be easily locatable, this information must be stored in a predetermined location. However, this control information is updated periodically during normal operation of the memory system 10, so memory wear would result from repeated erasure of the predetermined memory location. To avoid this problem, the control information is stored as a control block having a predetermined logical address rather than a predetermined physical address. Thus, the control block is rewritten to different areas of memory each time it is updated, but can always be accessed by the same logical address.

The logical address of the control block is close to the top of the logical address space of the memory 18, and is not accessible by the PC 12. The highest logical address available to the PC 12 is immediately below the control block address. The position of the control block in physical memory is determined using the block address tables.

Header address tables 138 are stored in control cells 56 using the following format. The HATs 138 have one entry for each erasable unit 39 in the memory 18. Only one HAT 138 is located in a control cell 56. Each HAT entry is 16 bytes wide, so successive HAT entries are located at 16 byte boundaries in a control cell 56. Thus, a control cell 56 can accommodate 32 entries.

The controller 16 translates a logical address to a physical address (where the format of the logical block address for the read/write block 60 to be read/written is that of logical address 110) in the following way.

The controller 16 uses the block address pointer 104 to locate the highest (nth) level block address pointer table 116, and accesses the correct entry in this table 116 by using the value of the nth field 112 of the read/write logical address.

This entry points to the next (n−1th level) block address pointer table 118. The entry pointed to by the n−1th field of the read/write address is then accessed. This procedure is repeated through the n levels of the table 118 until an entry in a block address table 136 is pointed to.

If this block address table entry is a direct pointer to an address in memory 18 then the controller 16 reads the erasable unit header 52 for the erasable unit 39 in which the read/write block 60 is located. The controller 16 then reads the cell map 70. The read/write block header portion 62 is then read by the controller 16 to verify that the logical block address field of the read/write block header 62 matches the logical address 110 of the read/write block 60.

Before a data transfer operation between the PC 12 or buffer memory 28 and the memory 18 is initiated, the controller 16 reads the cell map 70 from the erasable unit 39 being accessed to determine the usable/unusable status of all of the cells 50 spanned by the read/write block 60. During data transfer, the controller 16 monitors the data transfer to detect boundaries between usable cells 51 and either control cells 56 or defective cells 54. When a boundary is encountered the transfer is halted to allow the new (continuation) address to be loaded.

In the event that the write pointer address is lost, perhaps due to power failure, the correct address for the write pointer can be obtained by scanning data structures on the memory 18 until a partially written erasable unit 39 is found, that is, an erasable unit 39 having the write start flag asserted and the write finish flag not asserted. This is performed by reading the state of the flags in sequential erasable unit headers 52.

When the correct erasable unit 39 is found, the unit 39 is scanned until the first location is found (in a usable cell 51) having erased memory. This is the location of the write pointer.

The erase pointer is found by scanning erasable units 36 beginning with the location of the write pointer until the first erasable unit is found which ought to be erased according to the particular erase scheduling algorithm being implemented. Each unerased unit 39 is identified by reading the data structure header immediately following the erasable unit header 52.

Figure 14:
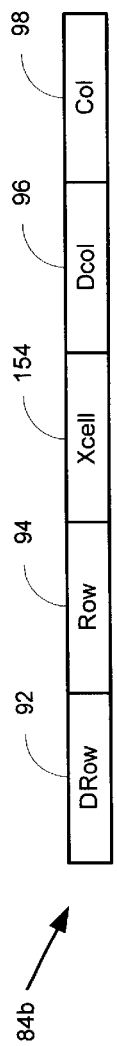
FIG. 14 shows the format of an erasable unit physical address.
Figure 15:
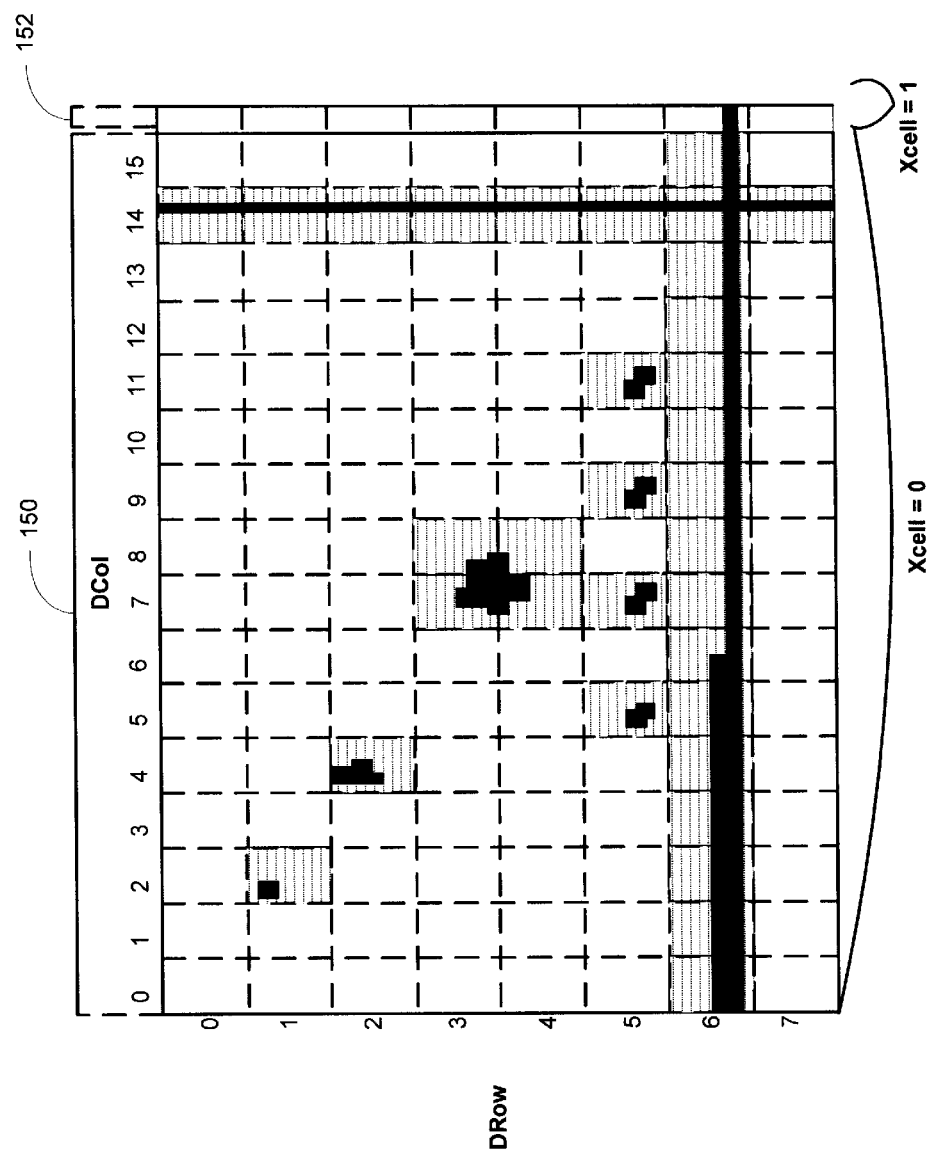
FIG. 15 shows an erasable unit having additional storage.

FIG. 14 shows the format of a modified erasable unit physical address 84b for use in a FLASH memory architecture having additional storage. FIG. 15 shows an erasable unit 39 of a FLASH memory having main storage 150 and additional storage 152 in the form of a single column of bytes. The erasable unit physical address 84b (FIG. 14) has an additional address bit (the xcell bit) 154 which is used to indicate whether the address represents main (bit 154 set to zero) or additional (bit 154 set to one) memory space.

When the xcell bit 154 is set to zero, the address 84b is used in the same way as described above for address field 84. When the xcell bit 154 is set to one, however, the xcell having the row address corresponding to columns 92 and 94 is accessed. When additional storage 152 is used, the cell map 70 contains an additional column which is used to indicate whether the xcell for each row is defective or working. If multiple columns of xcells are used, then columns 96 and 98 may be used to access the correct column of additional storage.

In use, the controller 16 writes all data structures to memory 18 by providing a physical address for the start location of the data and a length of the data segment to be written. In the case of a read/write block which spans one or more defective or control cells or which overlaps from one physical memory row to another, the data structure is written as a number of separate data segments. In the case of a control data structure within a control cell 56, the data is written as one or more data segments, each occupying one row or part of a row of the control cell 56. The physical address of a control data structure is either calculated by the controller 16 or is obtained by reading another control data structure.

Figure 16:
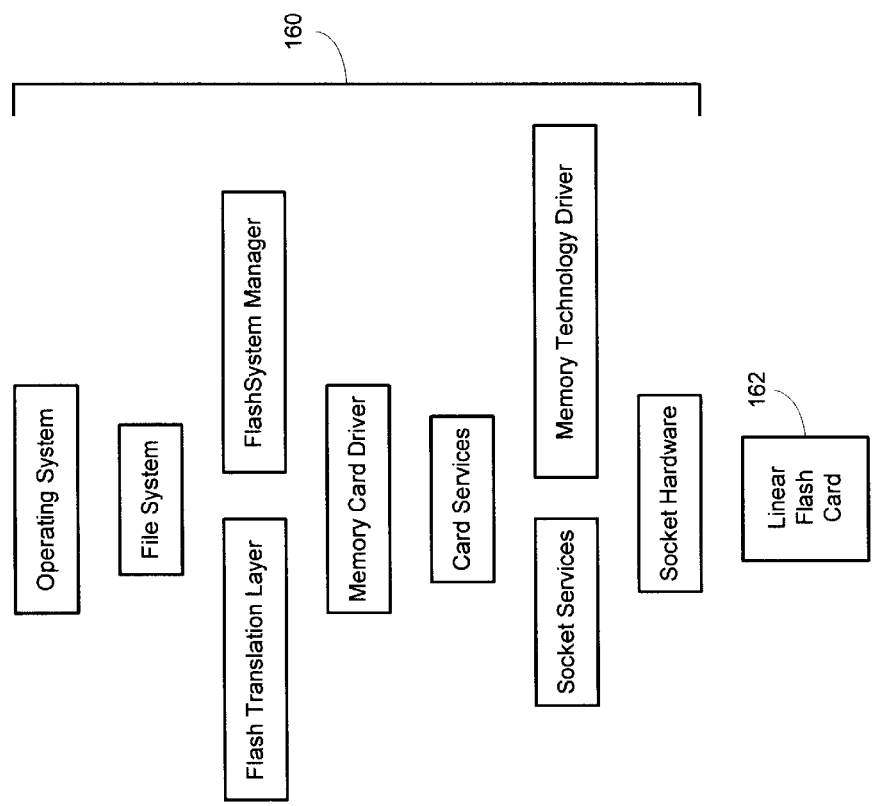
FIG. 16 shows the hierarchy of layers within a host system in an alternative embodiment of the present invention, where the controller is implemented as a system software layer.

The above embodiments relate to a controller 16 having a processor embedded within a FLASH memory card and the necessary firmware. However, the controller 16 may be embedded in a host system, such as the PC 12; alternatively, the controller 16 may be implemented as a system software layer (using control algorithms) in a host system which uses linear memory cards. FIG. 16 illustrates the hierarchy of layers 160 within a host system and a linear FLASH memory 162 to which the host is connected. In the system of FIG. 16, the cell maps 70 may be generated by a host software driver.

It will be appreciated that the present invention has the advantage that by using cells to store either control information or read/write blocks, an erasable block may store both control information and read/write blocks. In addition, by using pointers within cells to point to other cells, it is easy to store and keep track of control information which needs to be updated constantly. Erasure of the erasable blocks is simple because any valid control cells can be identified and relocated simply.

Various modifications may be made to the above described embodiment within the scope of the present invention. For example, an erasable block 36 may be larger or smaller than 64 Kbytes; likewise, a cell may be larger or smaller than 512 bytes, for example, 256 bytes may be preferred. The particular value chosen for the erasable unit size will depend on the manufacturer's choice but is generally related to the architecture, technology and cell type of the memory device 18. The particular value of the cell size chosen will depend on the memory harvest required: if a smaller cell size is used then a greater harvest is available but larger cell maps are required for each erasable unit as more cells are used. Error correction codes may be implemented in the above data structures to minimise the possibility of losing valuable data. Variable length data structures may be stored and retrieved. It will be appreciated that in other embodiments, the size of the data structures may be different to those described, for example, if a larger or smaller memory is used. In other embodiments, FLASH memory 18 may comprise memory devices which contain a large number of erasable blocks, each of which may be a row (sector) of the memory device or a small number of contiguous rows, typically sixteen. In this case, an erasable unit 39 managed by the controller 16 may comprise a plurality of erasable blocks. In other embodiments the word size may be greater or less than eight bits, for example, sixteen bits or sixty-four bits. In other embodiments, a chain length longer than four may be used. In such embodiments, long chains of SBAT entries may develop as a result of multiple relocation of a read/write block 60. In such cases, the chain may be broken by updating the PBAT entry that points to the beginning of the SBAT chain so that a new SBAT is pointed to. In other embodiments, the control cells 56 may be allocated in a different manner, for example, control cells 56 may be allocated to the last usable cells 51 in each row of the erasable unit 39, to the first cell in every second row; or more than one control cell 56 per row may be allocated. In other embodiments, the cell maps 70 may be constructed by the controller 16, rather than by a separate device (the test unit).

What is claimed is:

1. In a memory system for connection to a host, the system comprising: a non-volatile memory having a plurality of memory locations, and a controller for writing data structures to and for reading data structures from the memory, the system being architecturally configured so that the locations can be written to individually but can only be erased in blocks of locations, the improvement comprising:
the controller is adapted to form at least one erasable unit comprised of at least one erasable block, and to subdivide each erasable unit into an integral number of cells where each cell comprises a group of physically contiguous locations, and the controller is configured to: receive data structures from the host in segments having identical length; write data from said received host data structures to the memory in segments having variable lengths; read data structures from the memory in said segments having said identical length; and to nominate at least one said cell as unusable for storage of data from said received host data structures and the remainder of said cells as usable for storage of data from said received host data structures, and to prevent any said variable length segments from being written to said at least one unusable cell wherein at least one cell in each said erasable unit is designated as being reserved for storing control information and is therefore nominated as said at least one cell which is unusable for storage of data from said received host data structures wherein the at least one reserved cell is configured to have a plurality of entries comprising a secondary block address table (SBAT), and where each entry stores a plurality of fields, wherein a first field stored in a first entry is used to point to a second field stored in a second entry and only a most recently written field stored in an entry is considered to be valid and upon writes or relocations of a block a plurality of times, avoiding erasure of the SBAT each time such relocation occurs.

2. A memory system according to claim 1, wherein the memory locations in each cell are tested and if a defect is present in a cell, then the entire cell is nominated as being unusable for storage of data structures, cells not being so identified being nominated as usable for storage of data structures.

3. A memory system according to claim 1 wherein the nonvolatile memory comprises at least one memory device.

4. A memory system according to claim 3, wherein the controller controls a sub-controller incorporated into each of the at least one memory devices.

5. A memory system according to claim 3, wherein the controller is in the form of a single controller which controls the at least one memory device.

6. A memory system according to claim 1, further comprising a plurality of said reserved cells, wherein a portion of the reserved cells are used for storing address conversion information for converting an address received from the host to an address suitable for accessing the memory.

7. A memory system according to claim 6, wherein each reserved cell is used to store pointer information for pointing to the next reserved cell until the last reserved cell is reached, said last reserved cell pointing to an address in the memory storing the address suitable for accessing the memory.

8. A memory system according to claim 1, wherein the controller is configured to effect logical to physical address conversion by having a plurality of cells linked together to form a first hierarchy of cells including different levels, said different levels in the first hierarchy of cells being addressed by different bits from a logical address supplied by the host, so that a lowest cell in the first hierarchy provides one of the actual physical address required and pointer information for pointing to a second hierarchy of cells.

9. A memory system according to claim 8, where the first hierarchy of cells consists of cells which are reserved for storing control information.

10. A controller for use with a non-volatile memory having a plurality of locations that can be written to individually but can only be erased in blocks of locations, the controller forming at least one erasable unit, each said erasable unit comprising at least one erasable block, subdividing each erasable unit into an integral number of cells, each cell comprising a group of physically contiguous memory locations, and the controller being configured to: receive data structures from the host in segments having identical length; write data from said received host data structures to the memory in segments having variable lengths; read data structures from the memory in said segments having variable lengths and forward said read data structures to the host in segments having said identical length; and to nominate at least one said cell as unusable for storage of data from said received host data structures and the remainder of said cells as usable for storage for data from said received host data structures, and to prevent any said variable length segments from being written to said at least one unusable cell wherein at least one cell in each said erasable unit is designated as being reserved for storing control information and is therefore nominated as said at least one cell which is unusable for storage of data from said received host data structures wherein the at least one reserved cell is are configured to have a plurality of entries comprising a secondary block address table (SBAT), and where each entry stores a plurality of fields, wherein a first field stored in a first entry is used to point to a second field stored in a second entry and only a most recently written field stored in an entry is considered to be valid and upon writes or relocations of a block a plurality of times, avoiding erasure of the SBAT each time such relocation occurs.

* * * * *

UNITED STATES PATENT AND TRADEMARK OFFICE
CERTIFICATE OF CORRECTION

PATENT NO. : 6,813,678 B1
DATED : November 2, 2004
INVENTOR(S) : Alan Welsh Sinclair and Sergey Anatolievich Gorobets It is certified that error appears in the above-identified patent and that said Letters Patent is hereby corrected as shown below:

Title page,
Item [75], Inventors, replace "Sergei Anatolovich Gorobets" with -- Sergey Anatolievich Gorobets --.

Signed and Sealed this

Twenty-second Day of March, 2005

JON W. DUDAS
*Director of the United States Patent and Trademark Office*